(12) United States Patent
Mariyama et al.

(10) Patent No.: US 6,995,408 B2
(45) Date of Patent: Feb. 7, 2006

(54) BIDIRECTIONAL PHOTOTHYRISTOR CHIP

(75) Inventors: Mitsuru Mariyama, Kitakatsuragi-Gun (JP); Masaru Kubo, Kitakatsuragi-Gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/732,459

(22) Filed: Dec. 11, 2003

(65) Prior Publication Data

US 2004/0262633 A1 Dec. 30, 2004

(30) Foreign Application Priority Data

Dec. 18, 2002 (JP) .......................... P2002-366635

(51) Int. Cl.
*H01L 29/74* (2006.01)
*H01L 31/111* (2006.01)

(52) U.S. Cl. ...................... 257/119; 257/120
(58) Field of Classification Search ................ 257/107, 257/109, 110, 119, 120
See application file for complete search history.

(56) References Cited

U.S. PATENT DOCUMENTS 3,858,233 A * 12/1974 Miyata et al. .............. 257/445
5,939,755 A * 8/1999 Takeuchi et al. ............ 257/347
6,037,613 A * 3/2000 Mariyama ................... 257/119

FOREIGN PATENT DOCUMENTS

| JP | 5315603 | 11/1993 |
|----|---------|---------|
| JP | 6350077 | 12/1994 |
| JP | 8097403 | 4/1996 |
| JP | 8264755 | 10/1996 |
| JP | 10242449 | 9/1998 |

* cited by examiner

*Primary Examiner*—Hoai Pham
(74) *Attorney, Agent, or Firm*—Morrison & Foerster LLP

(57) ABSTRACT

A Schottky barrier diode 44 is formed between a P-gate diffusion region 33 and an N-type silicon substrate 31 in a photothyristor on a CH1 side and a photothyristor on a CH2 side. With this arrangement, the injection of minority carriers from the P-gate diffusion region 33 to the N-type silicon substrate 31 is restrained to reduce the amount of remaining carriers, and an excessive amount of carriers remaining in the N-type silicon substrate 31 during commutation has a reduced chance of moving toward the opposite channel side, allowing the commutation characteristic to be improved. Therefore, by a combination with an LED, there can be provided a light-fired coupler for firing and controlling the load.

10 Claims, 11 Drawing Sheets

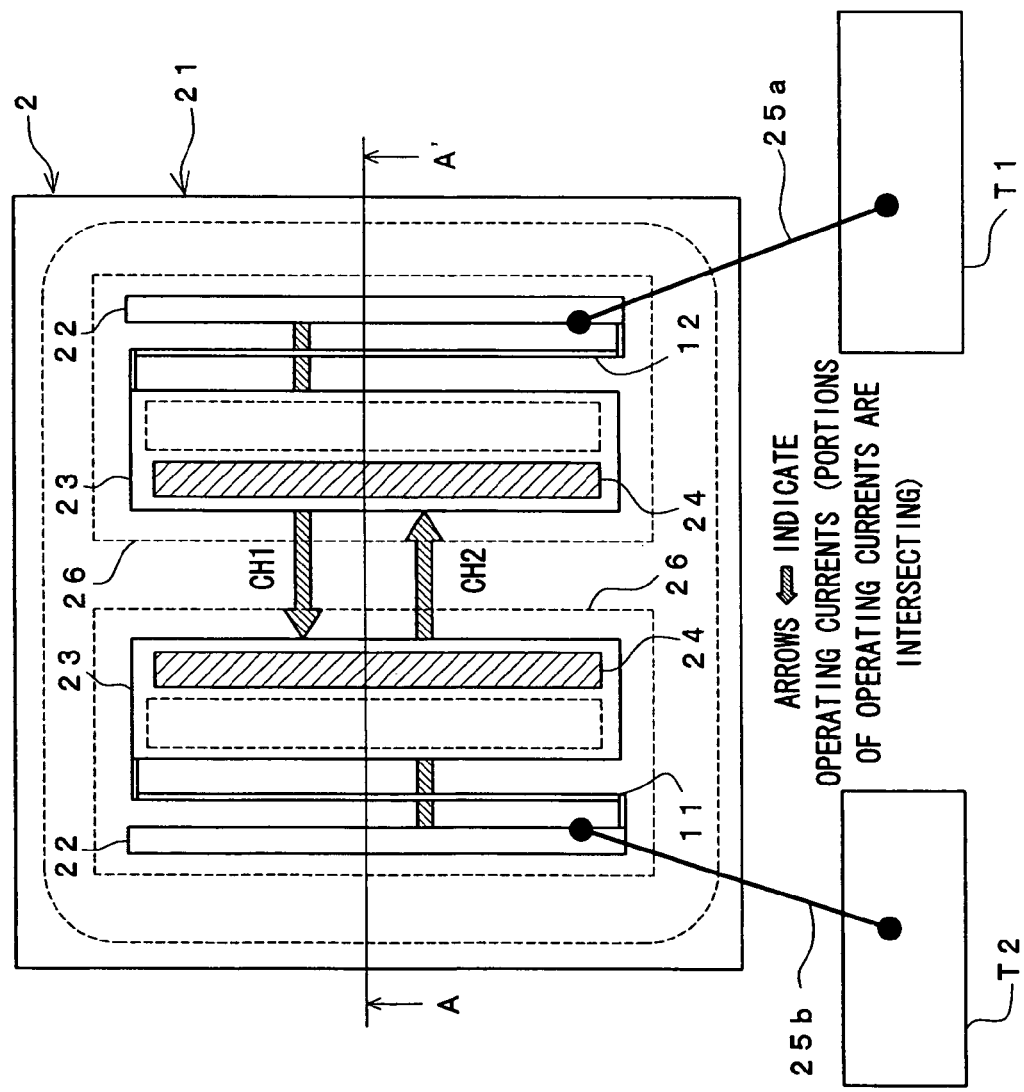

US 6,995,408 B2

BIDIRECTIONAL PHOTOTHYRISTOR CHIP

BACKGROUND OF THE INVENTION

The present invention relates to a bidirectional photothyristor chip.

Conventionally, as a solid-state relay (hereinafter abbreviated to SSR) to be used with an alternating current, there has been a circuit construction as shown in FIG. 9. This SSR 8 is constituted of a light-fired coupler 3 constructed of a light-emitting device 1 such as an LED (light-emitting diode) and a bidirectional photothyristor 2 for firing, a bidirectional thyristor (hereinafter occasionally referred to as a main thyristor) 4 for actually controlling the load and a snubber circuit 7 constructed of a resistor 5, a capacitor 6 and so on.

An equivalent circuit diagram of the light-fired coupler 3 that constitutes the SSR 8 is shown in FIG. 10. The bidirectional photothyristor 2 is constructed of a photothyristor 9 of CH (channel) 1 and a photothyristor 10 of CH2. The photothyristor 9 of CH1 is constituted by connecting the base of a PNP transistor Q1 to the collector of an NPN transistor Q2 and connecting the collector of the PNP transistor Q1 to the base of the NPN transistor Q2. Likewise, the photothyristor 10 of CH2 is constituted by connecting the base of a PNP transistor Q3 to the collector of an NPN transistor Q4 and connecting the collector of the PNP transistor Q3 to the base of the NPN transistor Q4.

Further, on the CH1 side, the emitter of the PNP transistor Q1 is connected directly to an electrode T1. On the other hand, the emitter and the base of the NPN transistor Q2 are connected directly and via a gate resistor 11, respectively, to an electrode T2. Likewise, on the CH2 side, the emitter of the PNP transistor Q3 is connected directly to the electrode T2. On the other hand, the emitter and the base of the NPN transistor Q4 are connected directly and via a gate resistor 12, respectively, to the electrode T1.

FIG. 11 is a schematic pattern layout of the bidirectional photothyristor 2 of FIG. 10. FIGS. 12A and 12B are schematic sectional views taken along the arrow line A–A' in FIG. 11. FIG. 12A shows an optically turned-on state, and FIG. 12B shows an optically turned-off state during voltage inversion (during commutation). This bidirectional photothyristor 2 is provided with two anode diffusion regions (P-type) 22 and two P-gate diffusion regions (P-type) 23 on the front surface side of the N-type silicon substrate 21, which are laterally inverted to each other in the figure. A cathode diffusion region (N-type) 24 is provided on the side opposite from the anode diffusion region 22 in each of the P-gate diffusion regions 23. Thus, a PNPN section that constitutes the photothyristor 9 of CH1 in FIG. 10 is formed extended from the anode diffusion region 22 on the right-hand side toward the cathode diffusion region 24 on the left-hand side in the figure. Moreover, a PNPN section that constitutes the photothyristor 10 of CH2 is formed extended from the anode diffusion region 22 on the left-hand side toward the cathode diffusion region 24 on the right-hand side in the figure.

That is, the PNP transistor Q1 on the CH1 side is constructed of the anode diffusion region 22 on the right-hand side, the N-type silicon substrate 21 and the P-gate diffusion region 23 on the left-hand side, while the NPN transistor Q2 on the CH1 side is constructed of the cathode diffusion region 24, the P-gate diffusion region 23 both on the left-hand side and the N-type silicon substrate 21. On the other hand, the PNP transistor Q3 on the CH2 side is constructed of the anode diffusion region 22 on the left-hand side, the N-type silicon substrate 21 and the P-gate diffusion region 23 on the right-hand side, while the NPN transistor Q4 on the CH2 side is constructed of the cathode diffusion region 24, the P-gate diffusion region 23 both on the right-hand side and the N-type silicon substrate 21. The anode diffusion region 22 and the electrode T1 on the right-hand side are connected to each other by an Au wire 25a, while the cathode diffusion region 24 and the electrode T1 are connected to each other via an Al electrode 26 on the right-hand side inside the chip. Moreover, the anode diffusion region 22 and the electrode T2 on the left-hand side are connected to each other by an Au wire 25b, while the cathode diffusion region 24 and the electrode T2 are connected to each other via an Al electrode 26 on the left-hand side inside the chip.

The bidirectional photothyristor 2, which has the aforementioned construction, operates as follows. That is, in FIGS. 10 through 12A, firstly, if the potential polarity is more positive on the electrode T1 side than on the electrode T2 side under the condition that a power voltage higher than the on-state voltage (about 1.5 V) of the device is applied as a bias across the electrode T1 and the electrode T2, then the NPN transistor Q2 on the CH1 side is turned on when the bidirectional photothyristor 2 receives an optical signal from the LED 1. Then, a base current is drawn from the PNP transistor Q1 on the CH1 side, and this PNP transistor Q1 is turned on. Subsequently, a base current is supplied to the NPN transistor Q2 on the CH1 side by a collector current of the PNP transistor Q1, and the PNPN section on the CH1 side is turned on by positive feedback to flow an on-state current corresponding to the load of the AC circuit from the electrode T1 to the electrode T2. In the above case, the positive feedback of the PNPN section does not occur on the CH2 side since the bias applying direction is reversed, and only a primary photoelectric current flows.

On the other hand, if the potential polarity is more positive on the electrode T2 side than on the electrode T1 side, then the PNPN section on the CH2 side is turned on through positive feedback operation quite similarly to the above-mentioned case, and only the primary photoelectric current flows on the CH1 side.

Thus, when the PNPN section on the CH1 side or the PNPN section on the CH2 side performs the firing operation, this current flows into the gate of the main thyristor 4, firing the main thyristor 4. As a prior art reference concerning the bidirectional photothyristor for use in a light-fired coupler as described above, there is, for example, a patent gazette of Japanese Patent Laid-Open Publication No. HEI 10-242449.

In the circuit construction of the SSR 8 shown in FIG. 9, it is the main thyristor 4 that actually controls the load current, and the bidirectional photothyristor 2 is used for optically firing the main thyristor 4. Then, the SSR 8, which has the aforementioned circuit construction, has a feature that it is electrically insulated.

In designing a general SSR device, the bidirectional photothyristor 2 for firing is made to receive light from the LED 1 and become operative with a photoexcitation current of about 10 $\mu$A generated at the time. On the other hand, the main thyristor 4 becomes operative with a gate trigger current of about 20 mA, which is the operating current of the bidirectional photothyristor 2. Therefore, the main thyristor 4 cannot be fired at all by the photoexcitation current of the LED 1.

In the case of the aforementioned device, which has the bidirectional channels CH1 and CH2 inside the single chip and is used as a switch for an AC circuit, its commutation characteristic (described in detail later) is an important criterion for evaluating the device. Due to this commutation characteristic, the main thyristor 4 becomes unable to control (turning-off control) the load if it does not have a capacity exceeding the value of the current that is desired to be controlled, disadvantageously resulting in malfunctioning. Likewise, the bidirectional photothyristor 2 is to also malfunction due to the commutation characteristic if it does not have a capacity exceeding the trigger current of the main thyristor 4, the current value being about 50 mA.

In recent years, the economic environment surrounding the electronic industry has become severer, and there are earnestly demanded cost reduction and improvement of handiness of electronic equipment. In order to cope with the above-mentioned demands, it has been attempted to directly control the load only by the bidirectional photothyristor with the main thyristor 4 eliminated to, for example, reduce the parts count in the conventional SSR that has a construction as shown in FIG. 9.

In the above case, if a bidirectional photothyristor as shown in FIG. 11 is employed as the bidirectional photothyristor 2, then the commutation characteristic of this bidirectional photothyristor becomes the most serious problem. This commutation characteristic is an important design parameter, and the controllable load current is determined by this commutation characteristic.

The aforementioned commutation characteristic is herein described. With regard to the commutation characteristic in the case of normal operation, as shown in FIG. 12A, if the incidence of light disappears in a half cycle period of the alternating current during which the CH1 is on, then the on-state continues due to the current holding property of the PNPN section during this half cycle period. Then, if a shift to the next half cycle occurs as shown in FIG. 12B, then the CH2 is not turned on unless there is incident light. However, if an inductive load exists in the AC circuit that is subjected to switching, then the phase of the on-state voltage is delayed relatively to the phase of the AC voltage applied across the electrode T1 and the electrode T2. Therefore, an AC voltage of the inverted phase has already been applied across the electrode T1 and the electrode T2 at the point of time when the CH1 is turned off. Therefore, a voltage of the inverted phase exhibiting a steep rise is to be applied to the CH2 side at the point of time when the CH1 is turned off.

Therefore, holes 27, which remain in the N-type silicon substrate 21 of the bidirectional photothyristor 2, move to the P-gate diffusion region 23 on the right-hand side as indicated by arrow A before disappearing to thereby turn on the PNP transistor on the CH2 side despite no incident light and to promote the positive feedback on the CH2 side, causing a malfunction (commutation failure) that the CH2 is turned on.

That is, the aforementioned "commutation characteristic" is a characteristic that expresses a maximum operating current value Icom that can be controlled without causing the commutation failure as described above.

When the load is directly controlled only by the bidirectional photothyristor 2 with the main thyristor 4 eliminated in the conventional SSR that has a construction as shown in FIG. 9, there is required a capacity enough to endure a load current of about 0.2 A in terms of the capacity of bidirectional photothyristor 2. However, there is a problem that the main thyristor 4 cannot be eliminated since the commutation characteristic Icom required for the bidirectional photothyristor 2 is not smaller than about 200 mArms in the above case, and the malfunction due to the commutation failure occurs in the bidirectional photothyristor 2, shown in FIG. 11, which normally exhibits the commutation characteristic Icom of about one fifth the value.

SUMMARY OF THE INVENTION

Accordingly, the object of the present invention is to provide a bidirectional photothyristor chip of an improved commutation characteristic that makes optical firing and load control possible with a single chip.

In order to achieve the above object, there is provided a bidirectional photothyristor chip of one semiconductor chip provided with a pair of photothyristor sections including a first diffusion region that has a second conductive type, a second diffusion region that is formed oppositely to the first diffusion region and has the second conductive type and a third diffusion region that is formed oppositely to the first diffusion region inside the second diffusion region and has a first conductive type on a surface of a substrate that has the first conductive type, the bidirectional photothyristor chip comprising:

a Schottky barrier diode formed between the second diffusion region that constitutes the photothyristor section and the substrate.

According to the above-mentioned construction, the injection of minority carriers from the second diffusion region to the substrate is restrained by the Schottky barrier diode, and the amount of carriers remaining in the substrate is reduced. Therefore, the carriers remaining in the substrate has a reduced chance of moving between the aforementioned one pair of channels in the thyristor section during commutation. That is, when the channel of, for example, one photothyristor section is unfired, the movement of the carriers remaining in the substrate located on the one photothyristor section side to the other photothyristor section side is reduced. As a result, the malfunction that the channel in the other photothyristor section is turned on by the positive feedback action on the other photothyristor section side is restrained, and the commutation characteristic is improved.

In one embodiment of the present invention, the Schottky barrier diode is opposed to the third diffusion region and is formed with a length approximately equal to that of the third diffusion region and with a prescribed width.

According to this embodiment, the value of the current (corresponding to the carrier injection that causes the malfunction) flowing from the second diffusion region that serves as the base of the transistor constituting the photothyristor section to the substrate that serves as the collector can be set by the width of the Schottky barrier diode.

In one embodiment of the present invention, an area of the Schottky barrier diode is changed by changing a width of the Schottky barrier diode, and a forward voltage of the Schottky barrier diode can be set by changing the area of the Schottky barrier diode.

In one embodiment of the present invention, the width of the Schottky barrier diode is set so that the forward voltage of the Schottky barrier diode is 20 mV or more lower than the forward voltage across the second diffusion region of the photothyristor section and the substrate.

According to this embodiment, if the forward voltage across the second diffusion region of the photothyristor section and the substrate is set to about 0.6 V, then the current flowing from the second diffusion region to the substrate is reduced by about one order. Thus, the commutation characteristic is improved.

In one embodiment of the present invention, an interval between two diffusion regions located with interposition of a gate of the Schottky barrier diode is set to a distance at which the Schottky barrier diode can effect pinch-off within its withstand voltage.

According to this embodiment, the Schottky barrier diode can effect pinch-off within the withstand voltage thereof, and therefore, high reliability is obtained without resulting in the destruction even in a use environment in which a maximum voltage of about 800 V is applied.

In one embodiment of the present invention, the substrate is an N-type silicon substrate, and an N$^+$ layer doped with phosphorus at a concentration of not smaller than $10^{15}$ cm$^{-3}$ and not greater than $10^{18}$ cm$^{-3}$ is formed on a back surface of the N-type silicon substrate.

According to this embodiment, the N$^+$ layer on the back surface of the N-type silicon substrate is doped with phosphorus at a concentration of not smaller than $10^{15}$ cm$^{-3}$. Therefore, a critical off-state voltage increase rate dv/dt of not lower than 1000 V/$\mu$s required for the bidirectional photothyristor to correctly function as a device is obtained. Moreover, the N$^+$ layer is doped with phosphorus at a concentration of not greater than $10^{18}$ cm$^{-3}$. Therefore, it is possible to obtain a commutation characteristic Icom of not smaller than about 200 mArms required for the provision of an SSR that directly controls the load only by the bidirectional photothyristor with the main thyristor eliminated.

In one embodiment of the present invention, the substrate is an N-type silicon substrate, each of the diffusion layers that constitute the one pair of photothyristor sections are arranged so that operating current regions of channels of the photothyristor sections do not intersect each other, and a channel isolation region for providing isolation between the operating current regions is provided on the surface of the substrate.

According to this embodiment, the movement of the carriers remaining in the substrate between the channels is limited by the channel isolation region during commutation. Therefore, the commutation characteristic is further improved.

In one embodiment of the present invention, the channel isolation region is constituted by including an oxygen doped semi-insulating polycrystalline silicon film doped with phosphorus formed on the surface of the N-type silicon substrate.

If the oxygen doped semi-insulating polycrystalline silicon film is doped with phosphorus, then the level in the oxygen doped semi-insulating polycrystalline silicon film is increased, and the silicon interface state (Qss) is consequently increased. Therefore, according to this embodiment, the holes of minority carriers in the N-type silicon substrate disappear in the channel isolation region, and the reduction in the hole lifetime is promoted. Thus, the movement of carriers between the channels during commutation is obstructed by the channel isolation region.

In one embodiment of the present invention, the channel isolation region is constituted by including an oxygen doped semi-insulating polycrystalline silicon film formed in contact with the surface of the N-type silicon substrate.

According to this embodiment, the oxygen doped semi-insulating polycrystalline silicon film is formed in contact with the surface of the N-type silicon substrate in the channel isolation region. Therefore, the silicon interface state Qss of the channel isolation region is remarkably increased, and therefore, the reduction in the hole lifetime is further promoted.

In one embodiment of the present invention, the channel isolation region is constituted by including a short-circuit diode formed on a surface of the semiconductor chip.

According to this embodiment, the carriers remaining in the substrate are absorbed by the diffusion region of the short-circuit diode in the channel isolation region, and the lifetime of the remaining carriers is reduced.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 11 is a view showing the schematic pattern layout of a bidirectional photothyristor 2 in FIG. 10.

DETAILED DESCRIPTION OF THE PREFERRED EMBODIMENTS

Figure 1:
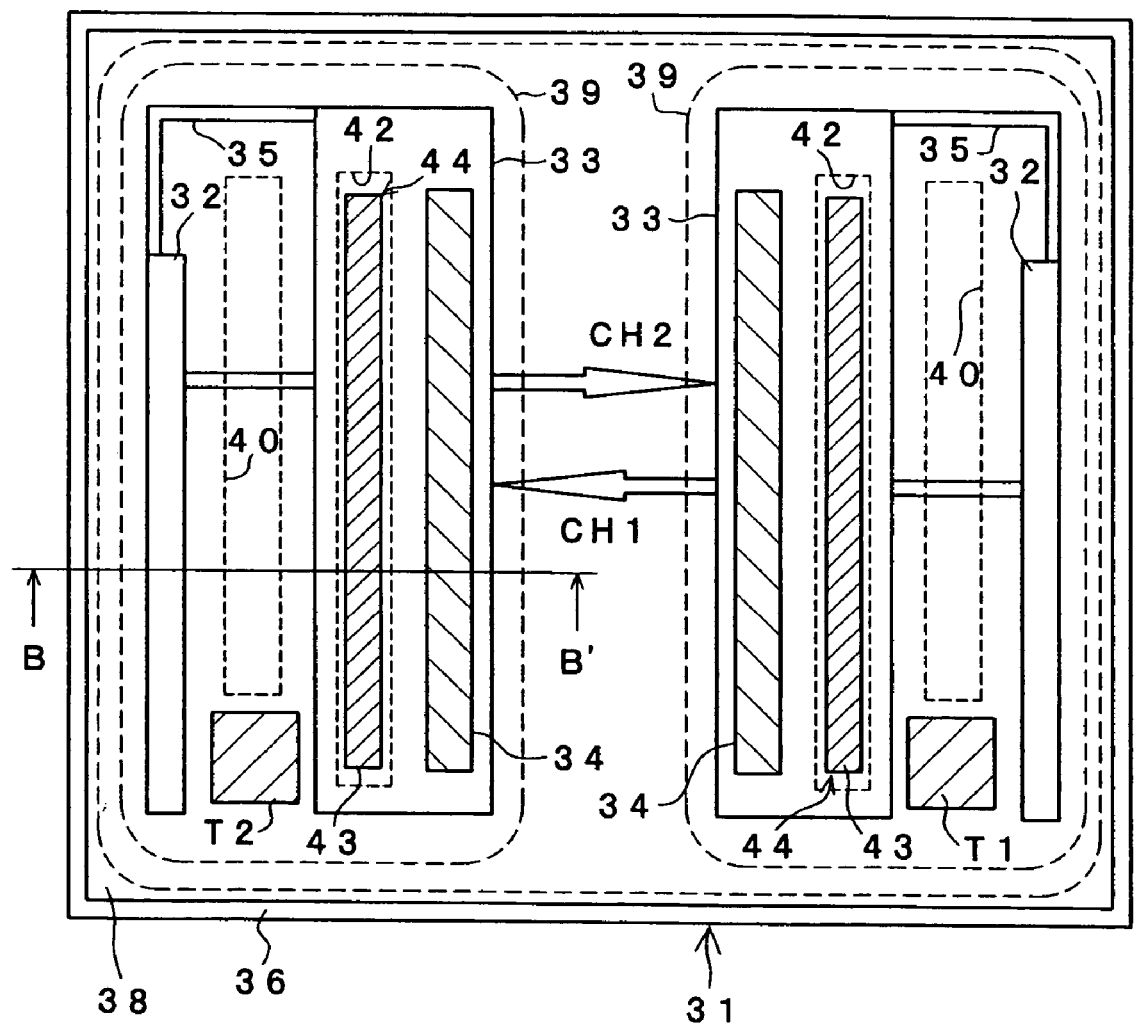
FIG. 1 is a view showing the schematic pattern layout of a bidirectional photothyristor chip of this invention.

This invention will be described in detail below on the basis of the embodiments shown in the drawings.

(First Embodiment)

Figure 2:
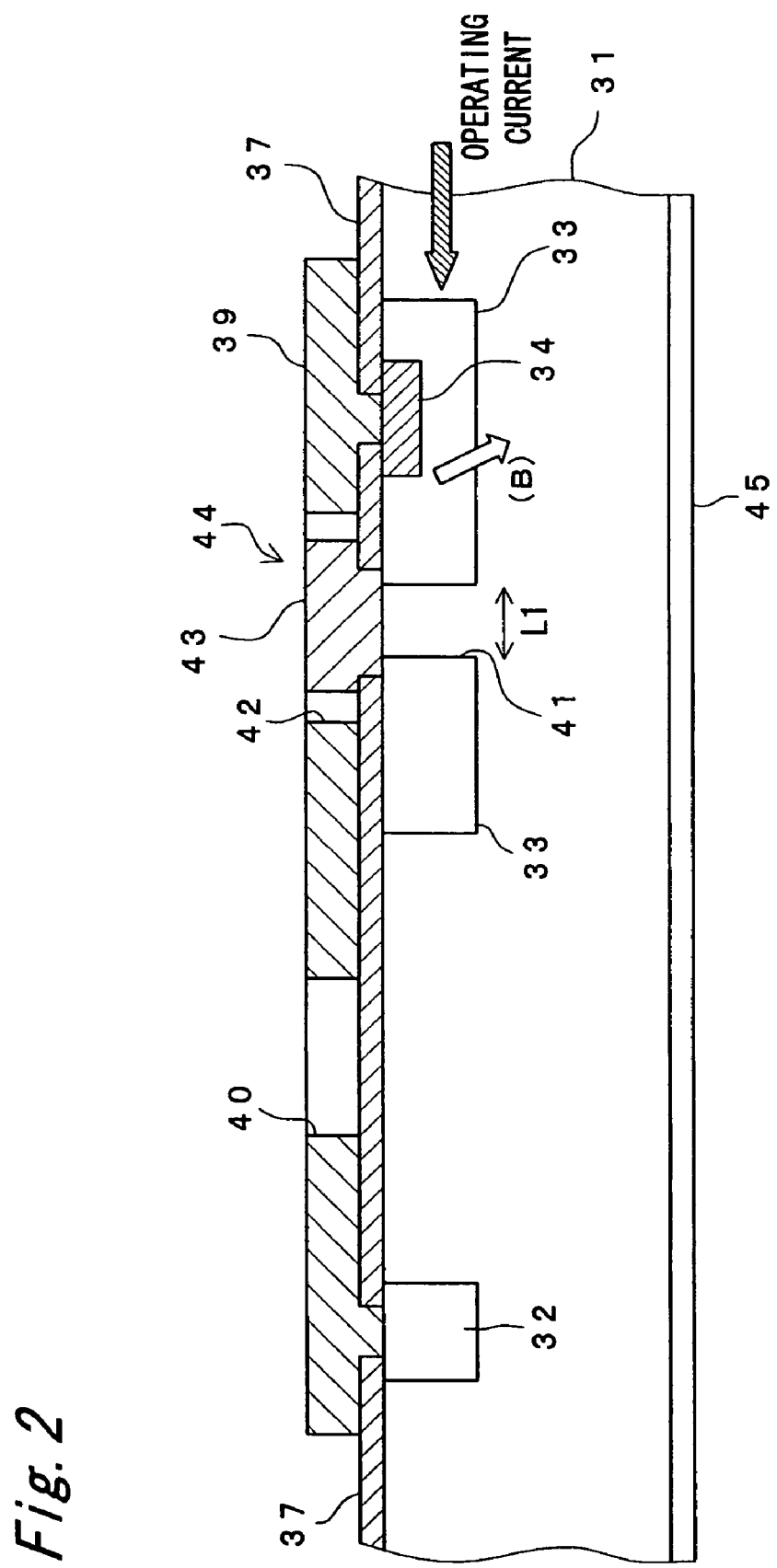
FIG. 2 is a sectional view taken along the arrow line B–B' in FIG. 1.
Figure 3:
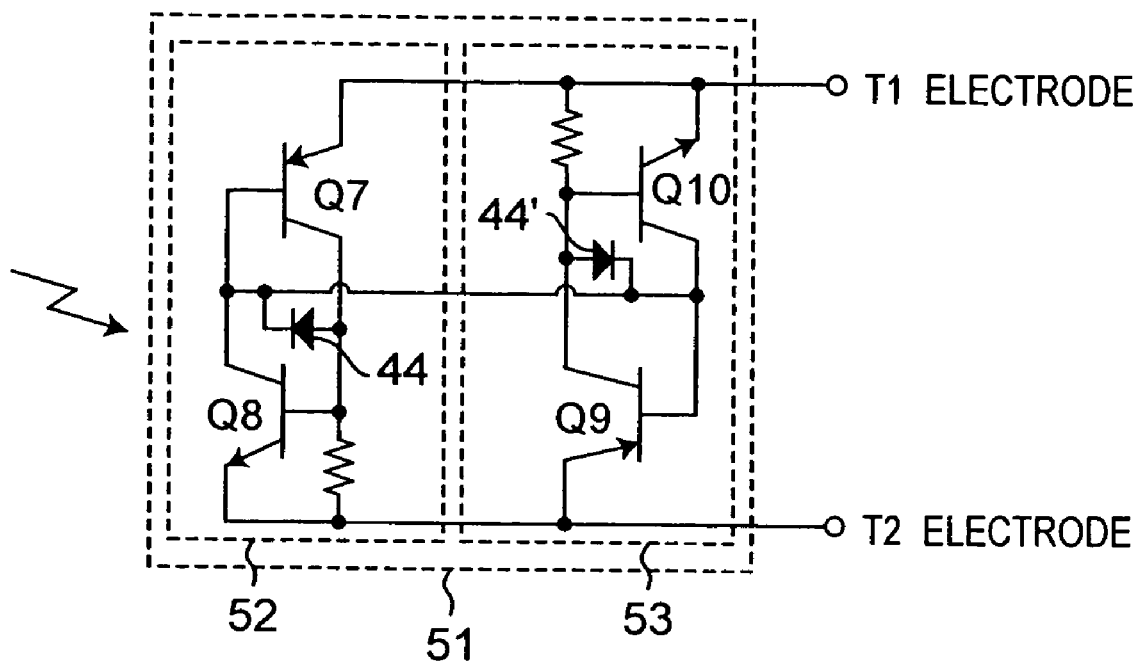
FIG. 3 is an equivalent circuit diagram of the bidirectional photothyristor chip shown in FIG. 1.

FIG. 1 shows a schematic pattern layout of the bidirectional photothyristor chip of the present embodiment. FIG. 2 is a sectional view taken along the arrow line B–B' in FIG. 1. FIG. 3 is an equivalent circuit diagram of the bidirectional photothyristor chip of the present embodiment. It is to be noted that the pattern layout of the present photothyristor chip basically has the same pattern layout as that of the conventional bidirectional photothyristor 2 show in FIG. 11.

The bidirectional photothyristor chip has a construction as follows. That is, two anode diffusion regions (P-type) 32 and two P-gate diffusion regions (P-type) 33 opposed to these anode diffusion regions 32 are provided laterally inverted to each other in the figure on the front surface side of an N-type silicon substrate 31. A cathode diffusion region (N-type) 34 is provided on the side opposite from the anode diffusion region 32 in each of the P-gate diffusion regions 33. Thus, a PNPN section that constitutes a photothyristor on the CH1 side is formed extended from the anode diffusion region 32 on the right-hand side toward the cathode diffusion region 34 on the left-hand side in the figure. Moreover, a PNPN section that constitutes a photothyristor on the CH2 side is formed extended from the anode diffusion region 32 on the left-hand side toward the cathode diffusion region 34 on the right-hand side in the figure. It is to be noted that the reference numeral 35 denotes gate resistors.

An N-type diffusion region 36 as a channel stopper is formed along the periphery of the chip. Then, an $SiO_2$ film 37 is formed on the surface of the N-type silicon substrate 31, and an opening is provided in the portion above the anode diffusion region 32 and the cathode diffusion region 34 of this $SiO_2$ film 37. Moreover, an Al electrode 38 is formed on the $SiO_2$ film 37 above the N-type diffusion region 36 as indicated by the dashed lines. Further, an Al electrode (indicated by the dashed lines) 39 is formed so as to cover the anode diffusion region 32 and the P-gate diffusion region 33 on the $SiO_2$ films 37 located in the left-hand portion and the right-hand portion. It is to be noted that an aperture 40 is formed to serve as a light-receiving portion between the anode diffusion region 32 and the P-gate diffusion region 33 of the Al electrode 39.

An electrode T2 is formed right above the Al electrode 39 in the left-hand portion and connected to the anode diffusion region 32 and the cathode diffusion region 34 via the Al electrode 39. Likewise, an electrode T1 is formed right above the Al electrode 39 in the right-hand portion and connected to the anode diffusion region 32 and the cathode diffusion region 34 via the Al electrode 39. In the above case, insulation is provided by the $SiO_2$ film 37 between the P-gate diffusion region 33 and the electrodes T1 and T2.

A rectangular aperture 41, which has approximately the same length as that of the cathode diffusion region 34 and in which no P-type impurity is diffused, is provided parallel to the cathode diffusion region 34 in the region of the P-gate diffusion region 33 between the left-hand side and the right-hand side in which the cathode diffusion region 34 is not provided. Moreover, an opening is formed in the position of the aperture 41 of the P-gate diffusion region 33 at the $SiO_2$ film 37 so as to surround this aperture 41. Further, an opening 42 is formed in the position of the aperture of the $SiO_2$ film 37 at the Al electrode 39 so as to surround this aperture. Then, a rectangular Al electrode 43 is formed in the aperture 42 of the Al electrode 39 and in the opening of the $SiO_2$ film 37 along the aperture 42 of the Al electrode 39. In the above case, an electrically insulative space is formed between the Al electrode 39 and the Al electrode 43.

As described above, the Al electrode 43 is in direct contact with the N-type silicon substrate 31 in the aperture 41 of the P-gate diffusion region 33 via the opening of the $SiO_2$ film 37. Thus, a Schottky barrier diode 44 is formed between the P-gate diffusion region 33 and the N-type silicon substrate 31. Therefore, the injection of minority carriers (holes) from the P-gate diffusion region 33 to the N-type silicon substrate 31 as indicated by the arrow B is restrained. As a result, the amount of carriers remaining in the N-type silicon substrate 31 is reduced, allowing the commutation characteristic to be improved. In the aforementioned description, Al is employed as the metallic material that constitutes the Schottky barrier diode 44. However, it is acceptable to employ a metallic material of Cr, Mo, Ti, Pt or the like in place of Al.

An $N^+$ layer 45 is formed by implanting phosphorus into the back surface of the N-type silicon substrate 31 to a concentration of $10^{16}$ cm$^{-3}$ by the ion implantation method. As described above, by forming the $N^+$ layer 45 by implanting phosphorus at a high concentration into the back surface of the N-type silicon substrate 31, reflection of carriers occurs in this $N^+$ layer 45, and a luminous sensitivity is increased by the effect of the so-called BSF (Back Surface Field) such that an equivalent lifetime is increased. If the back surface of the N-type silicon substrate 31 is made to remain $N^-$ (left intact as the N-type substrate) without adopting the above-mentioned structure, then the carriers easily recombine in the back surface of the N-type silicon substrate 31, and therefore, the equivalent lifetime is reduced.

The latter is advantageous in terms of the commutation characteristic since the equivalent lifetime is small when designing constant of the equivalent circuit of the photothyristor as shown in FIG. 3, whereas the current amplification factor Hfe(pnp) of the PNP transistor is reduced to deteriorate the luminous sensitivity. In order to make compensation for this, it is required to increase the gate resistor 35 and the current amplification factor Hfe(npn) of the NPN transistor in the circuit constant designing, and this causes a problem that the device principal characteristic is not satisfied due to decreasing the critical off-state voltage increase rate dv/dt. The critical off-state voltage increase rate dv/dt characteristic also depends on the lifetime of the N-type silicon substrate 31. (1) In the case where the back surface is $N^-$, the hole lifetime $\tau_p$ is small, and the diffusion capacitance of the anode diffusion region 32 is reduced, consequently increasing the operative response speed of the PNP transistor and reducing the critical off-state voltage increase rate dv/dt. On the other hand, (2) in the case where the back surface is $N^+$, the hole lifetime $\tau_p$ is large, and the diffusion capacitance of the anode diffusion region 32 is increased, consequently reducing the operative response speed of the PNP transistor and increasing the critical off-state voltage increase rate dv/dt.

Accordingly, in order to satisfy the trade-off relation between this commutation characteristic and the critical off-state voltage increase rate dv/dt characteristic, it is required to optimize the phosphorus concentration in the back surface of the N-type silicon substrate 31 to set the characteristic of the current amplification factor Hfe(pnp) of the PNP transistor to an arbitrary circuit constant.

If the relation between the N-type impurity (phosphorus) concentration in the back surface of the N-type silicon substrate 31 and the maximum operating current value Icom controllable without causing the commutation failure is examined, then the commutation characteristic Icom tends to reduce as the N-type impurity concentration increases. Then, in providing an SSR that directly controls the load only by the bidirectional photothyristor with the main thyristor eliminated, the commutation characteristic Icom required for the bidirectional photothyristor is not smaller than about 200 mArms. Therefore, the N-type impurity concentration in the back surface of the substrate in the present embodiment is required to be not greater than $10^{18}$ cm$^{-3}$.

On the other hand, if the relation between the N-type impurity concentration in the back surface of the N-type silicon substrate 31 and the critical off-state voltage increase rate dv/dt is examined, then the critical off-state voltage increase rate dv/dt tends to increase as the N-type impurity concentration increases. Then, in order to make the bidirectional photothyristor normally function as a device, there is required a critical off-state voltage increase rate dv/dt of not lower than 1000 V/$\mu$s. Therefore, the N-type impurity concentration in the back surface of the substrate in the present embodiment is required to be not smaller than $10^{15}$ cm$^{-3}$.

As described above, in order to satisfy the requirement of both the commutation characteristic Icom and the critical off-state voltage increase rate dv/dt characteristic, which have a mutually trade-off relation, the $N^+$ layer 47 should preferably have a phosphorus concentration of not smaller than $10^{15}$ cm$^{-3}$ and not greater than $10^{18}$ cm$^{-3}$.

Moreover, the area and the forward voltage VF of the Schottky barrier diode 44 have an approximately inversely proportional relation. On the other hand, the area and the commutation characteristic Icom have an approximately proportional relation. Therefore, a proper lower limit value of the area of the Schottky barrier diode 44 is determined depending on the desired commutation characteristic Icom of the thyristor to be adopted. In concrete, the proper lower limit value is determined depending on the parameters of the amount of the remaining carriers, the lifetime of the remaining carriers, a grace period to the occurrence of the malfunction and so on. On the other hand, since an increase in the area leads to the expansion of the chip size, a proper upper limit value of the area is determined by a maximum value capable of tolerating the evil influence.

As one concrete example, the area of the Schottky barrier diode 44 is set so that the forward voltage VF of the Schottky barrier diode 44 becomes equal to or lower than 0.615 V, which is 20 mV lower than the forward voltage VF (about 0.635 V) across the P-gate diffusion region 33 and the N-type silicon substrate 31 of the thyristor to be adopted. The reason why the forward voltage VF of the Schottky barrier diode 44 is set as described above is to obtain the effect of reducing the current as a consequence of clamping the current (corresponding to the carrier injection that causes the malfunction) flowing from the base to the collector of the NPN transistor by the Schottky barrier diode 44. It is to be noted that the forward voltage VF of the Schottky barrier diode 44 should preferably be 30 mV to 35 mV lower than the forward voltage VF across the P-gate diffusion region 33 and the N-type silicon substrate 31.

That is, the area of the Schottky barrier diode 44 can easily be set as follows. First of all, the length of the Schottky barrier diode 44 is set to a length equal to that of the adjacent cathode diffusion region 34. Then, the width of the Schottky barrier diode 44 is rightsized so as to provide the forward voltage VF set as described above.

Moreover, with regard to the structure of the Schottky barrier diode 44, which is used in an environment in which a maximum voltage close to 800 V is applied due to the device characteristics, a width L1 of the aperture 41 of the P-gate diffusion region 33 is therefore required to be set to a distance such that the Schottky barrier diode 44 can effect pinch-off within its withstand voltage. In the present embodiment, the width is set to 50 μm.

In the equivalent circuit shown in FIG. 3, there are included a bidirectional photothyristor chip 51 of the present embodiment, a photothyristor 52 on the CH1 side, a photothyristor 53 on the CH2 side, PNP transistors Q7 and Q9 constructed of the anode diffusion region 32, the N-type silicon substrate 31 and the P-gate diffusion region 33, NPN transistors Q8 and Q10 constructed of the cathode diffusion region 34, the P-gate diffusion region 33 and the N-type silicon substrate 31 and the Schottky barrier diodes 44 and 44'.

As described above, in the bidirectional photothyristor chip of the present embodiment, the Schottky barrier diodes 44 and 44' are formed between the P-gate diffusion region 33 and the N-type silicon substrate 31 in the photothyristor 52 on the CH1 side and the photothyristor 53 on the CH2 side, respectively. Therefore, the injection of minority carriers (holes) from the P-gate diffusion region 33 into the N-type silicon substrate 31 is restrained to reduce the remaining carriers, and the chance of the excessive carriers remaining in the N-type silicon substrate 31 during commutation (process through which the load current attenuates in correspondence with the AC voltage and the thyristor becomes unfired in accordance with the timing of the holding current) moving toward the opposite channel side can be reduced.

Figure 9:
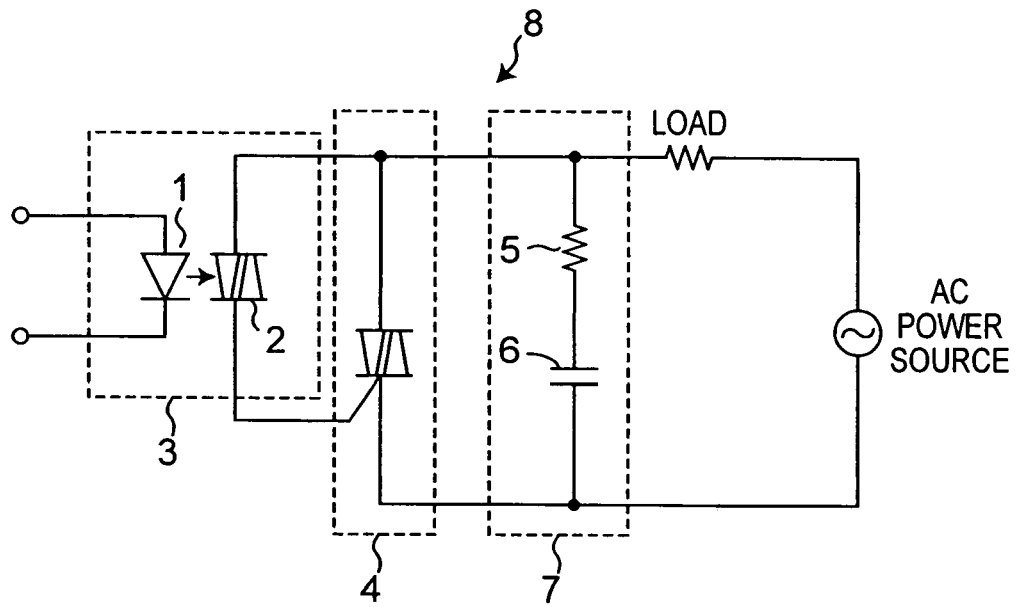
FIG. 9 is a view showing a circuit construction of an SSR.
Figure 10:
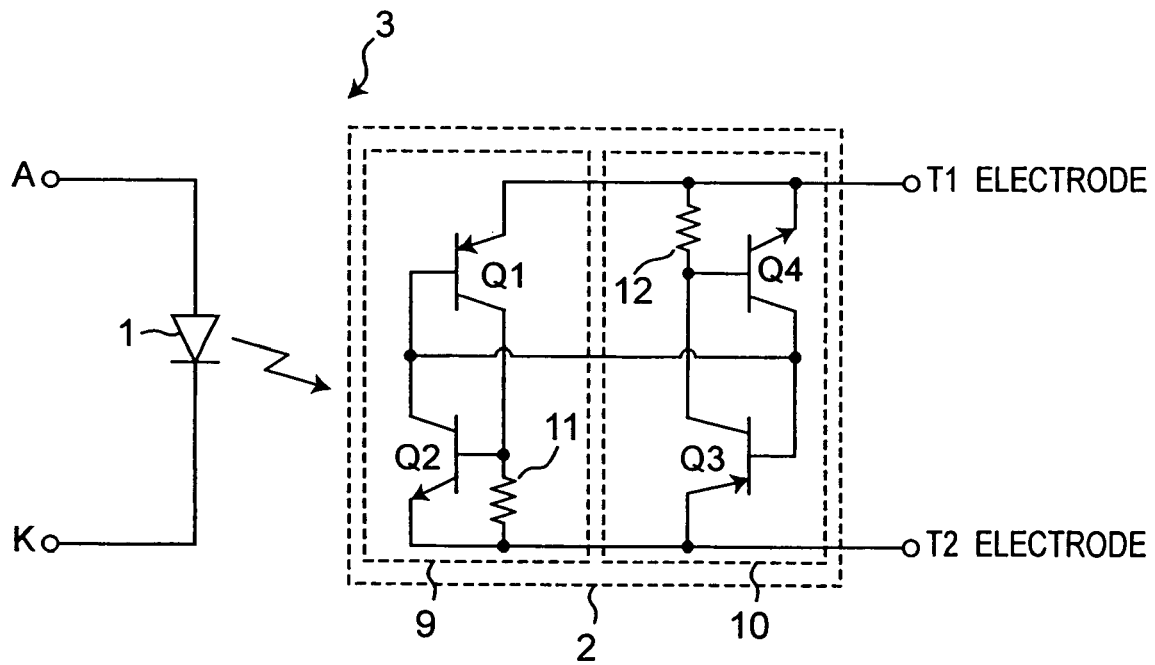
FIG. 10 is an equivalent circuit diagram of a light-fired coupler in FIG. 9.
Figure 12A:
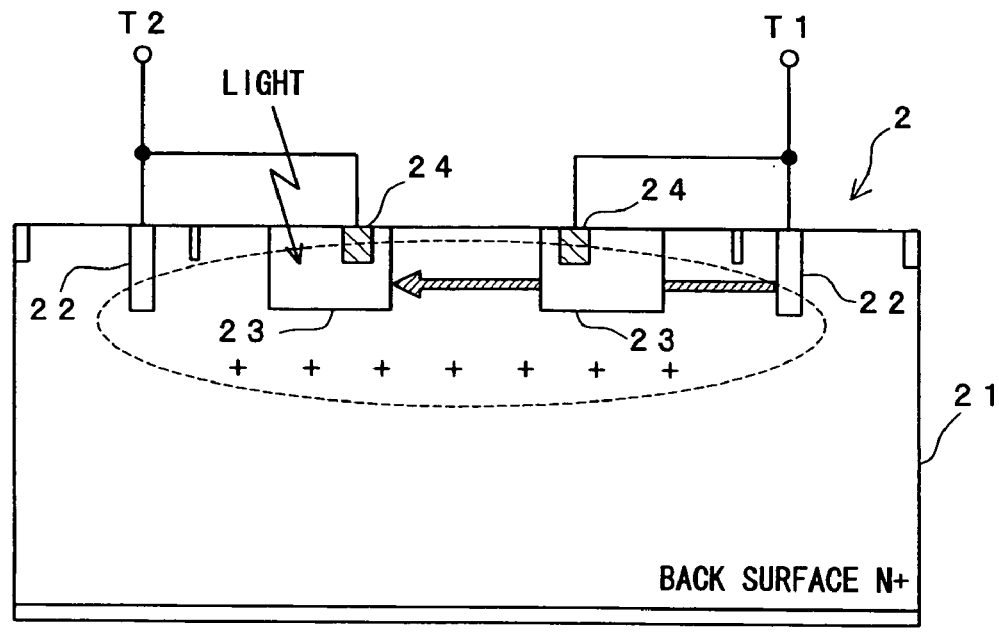
FIGS. 12A and 12B are sectional views taken along the arrow line A–A' in FIG. 11.
Figure 12B:
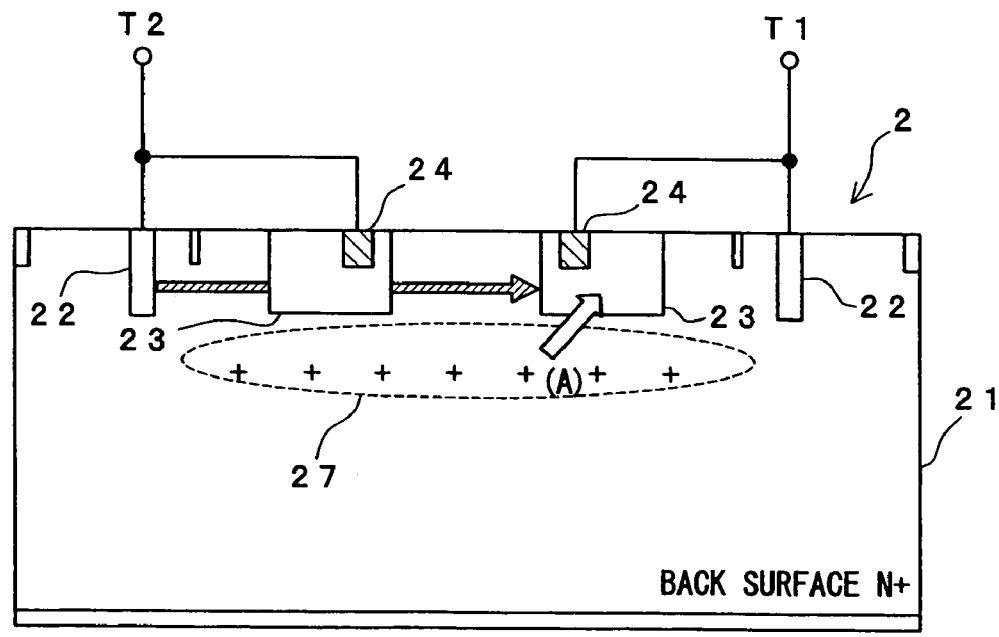

That is, the bidirectional photothyristor chip of the present embodiment can be controlled without malfunctioning with a load current up to about 0.2 A, and this means that the chip has a function equivalent to that of the main thyristor of the aforementioned SSR. Therefore, by employing the photothyristor chip of the present embodiment, it is possible to provide an inexpensive SSR, which has a reduced parts count and is constituted of the light-fired coupler for firing and load control constructed of an LED and the bidirectional photothyristor chip of the present embodiment and a snubber circuit, by eliminating the main thyristor 4 in FIG. 9.

(Second Embodiment)

In the bidirectional photothyristor chip of the first embodiment, the operating current regions of CH1 and CH2 intersect each other, as is apparent from its pattern layout. Therefore, the chip has the advantage that it is allowed to be reduced in chip size and compactly designed. On the contrary, interference of carriers occurs due to the intersection of the operating currents of CH1 and CH2, and though the injection of minority carriers (holes) into the N-type silicon substrate 31 is restrained to reduce the amount of remaining carriers, the commutation characteristic Icom is relatively low (deteriorated). Accordingly, in the present embodiment, a bidirectional photothyristor chip, of which the commutation characteristic Icom is further improved, will be described.

Figure 4:
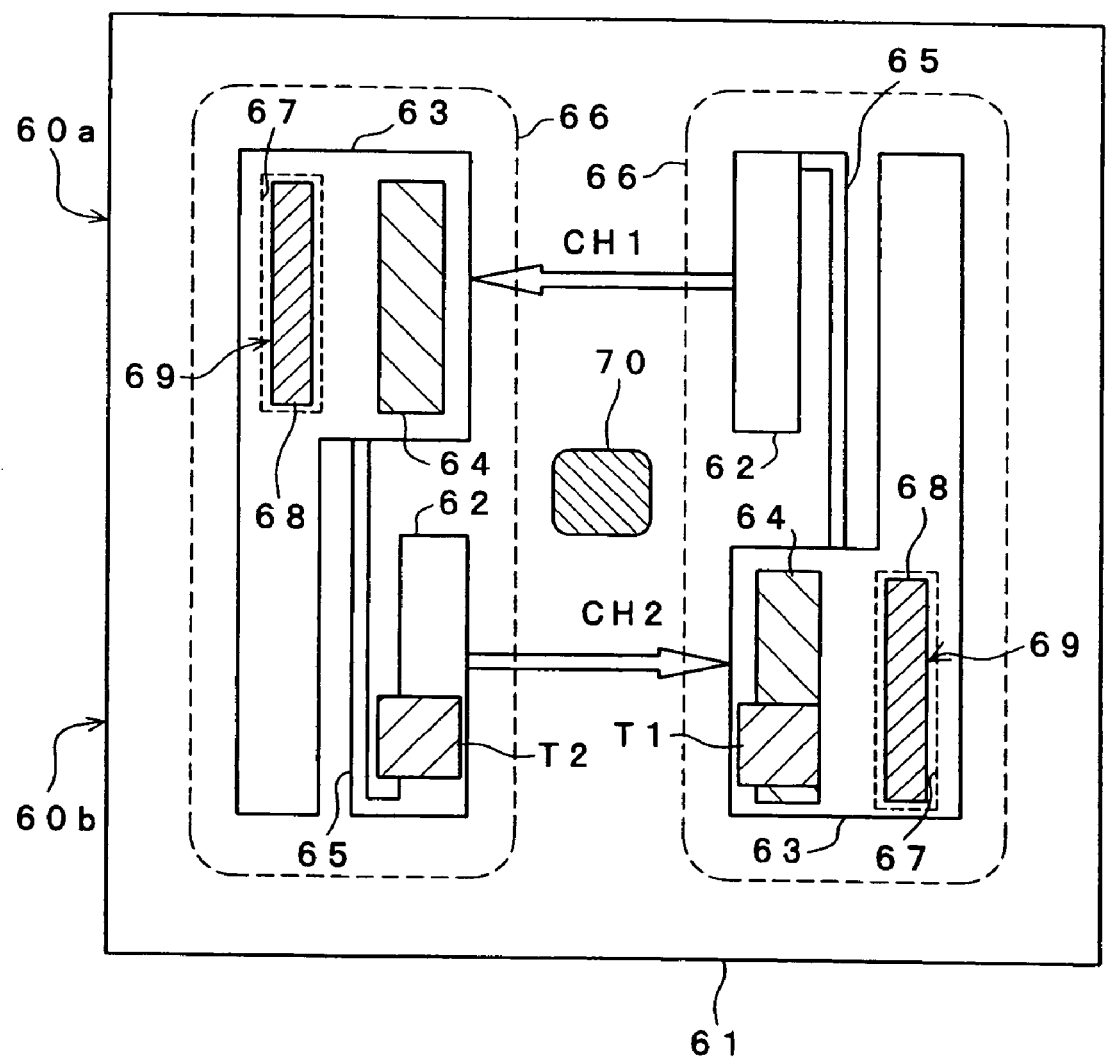
FIG. 4 is a view showing a schematic pattern layout different from that of FIG. 1.

FIG. 4 shows a schematic pattern layout of the bidirectional photothyristor chip of the present embodiment. Although neither the sectional view nor the equivalent circuit diagram of FIG. 4 is shown, they are basically similar to those of FIGS. 2 and 3.

The bidirectional photothyristor chip of the present embodiment has a pattern layout such that the anode diffusion regions 32, the P-gate diffusion regions 33 and the cathode diffusion regions 34 located on both sides in the pattern layout of the bidirectional photothyristor chip of the first embodiment are reduced in length by more than half, and the anode diffusion regions reduced more than half are arranged roughly straightly beside the cathode diffusion regions reduced more than half. Thus the anode diffusion region on the CH1 side and the P-gate diffusion region and the cathode diffusion region on the CH1 side are opposed to each other, while the anode diffusion region on the CH2 side and the P-gate diffusion region and the cathode diffusion region on the CH2 side are opposed to each other.

That is, in the bidirectional photothyristor chip of the present embodiment, as shown in FIG. 4, an anode diffusion region (P-type) 62 and a P-gate diffusion region (P-type) 63 opposed to this anode diffusion region 62 are provided in a lower portion 60*b* and in an upper portion 60*a*, respectively, on the left-hand side and vertically inverted on the right-hand side in FIG. 4 on the front surface side of an N-type silicon substrate 61. Then, cathode diffusion regions (N-type) 64 and 64 are provided on the side near the anode diffusion region 62 inside both the P-gate diffusion regions 63 and 63. Further, the side opposite from the region where the cathode diffusion region 64 is formed in the P-gate diffusion region 63 of the upper left-hand portion 60*a* is extended to the back of the anode diffusion region 62 of the lower left-hand portion 60*b* (i.e., of the opposite channel). Likewise, the side opposite from the region where the cathode diffusion region 64 is formed in the P-gate diffusion region 63 of the lower right-hand portion 60*b* is extended to the back of the anode diffusion region 62 of the upper right-hand portion 60a. With this arrangement, a PNPN section is provided extended from the anode diffusion region 62 toward the cathode diffusion region 64 in each of the upper portion 60a and the lower portion 60b of the chip. It is to be noted that the reference numeral 65 denotes a gate resistor.

As described above, in the bidirectional photothyristor chip of the present embodiment, the anode diffusion region 62 is opposed to the P-gate diffusion region 63 and the cathode diffusion region 64 on the CH1 side in the upper portion 60a. Likewise, the anode diffusion region 62 is opposed to the P-gate diffusion region 63 and the cathode diffusion region 64 on the CH2 side in the lower portion 60b. With this arrangement, the operating current regions of CH1 and CH2 can be prevented from intersecting each other dissimilarly to the bidirectional photothyristor chip of the first embodiment, in which the P-gate diffusion region 33 and the cathode diffusion region 34 on the CH1 side and the P-gate diffusion region 33 and the cathode diffusion region 34 on the CH2 side are opposed to each other throughout the entire width of the chip.

Then, there is formed an Al electrode 66, which covers the P-gate diffusion region 63 and the cathode diffusion region 64 on the CH1 side and the anode diffusion region 62 on the CH2 side as indicated by the dashed lines. Likewise, there is formed an Al electrode 66, which covers the P-gate diffusion region 63 and the cathode diffusion region 64 on the CH2 side and the anode diffusion region 62 on the CH1 side as indicated by the dashed lines.

Then, there is provided an aperture (not shown), which has approximately the same length as that of the cathode diffusion region 64 and in which no P-type impurity is diffused, is provided parallel to the cathode diffusion region 64 in the region of the P-gate diffusion region 63 in the left-hand portion and the P-gate diffusion region 63 in the right-hand portion where the cathode diffusion region 64 is not provided. Moreover, an opening 67 is formed in the position of the aperture of the P-gate diffusion region 63 at the Al electrode 66 so as to surround this aperture. Then, an Al electrode 68 brought in direct contact with the N-type silicon substrate 61 is formed inside the aperture 67 of the Al electrode 66, and a Schottky barrier diode 69 is formed between the P-gate diffusion region 63 and the N-type silicon substrate 61.

Therefore, the injection of minority carriers (holes) from the P-gate diffusion region 63 to the N-type silicon substrate 61 is restrained. As a result, the amount of carriers remaining in the N-type silicon substrate 61 is reduced, allowing the commutation characteristic to be improved.

Although no description is provided, an $SiO_2$ film is formed on the N-type silicon substrate 61 similarly to the case of the bidirectional photothyristor chip of the first embodiment, providing insulation with respect to the Al electrode 66 in required portions. Moreover, in FIG. 4, the N-type diffusion region as the channel stopper formed along the periphery of the chip and the Al electrode on this N-type diffusion region are not shown in FIG. 4. Moreover, an electrode T1 and an electrode T2 are formed right above the Al electrode 66 similarly to the case of the bidirectional photothyristor chip of the first embodiment.

In the present embodiment, a channel isolation region 70 is formed extended in the direction of CH1 and CH2 between the anode diffusion region 62 on the left-hand side and the anode diffusion region 62 on the right-hand side and between CH1 of the upper portion 60a and CH2 of the lower portion 60b on the N-type silicon substrate 61. Therefore, holes of minority carriers in the N-type silicon substrate 61 are drawn in by this channel isolation region 70 during the commutation, so that the movement of holes between the channels is limited. Therefore, it is difficult for the holes remaining in the N-type silicon substrate 61 of the upper portion 60a to move to the lower portion 60b when, for example, CH1 is turned off. As a result, in cooperation with the effect of restraining the injection of minority carriers (holes) from the P-gate diffusion region 63 to the N-type silicon substrate 61 produced by the Schottky barrier diode 69 and the effect that the operating current regions of CH1 and CH2 do not intersect each other, the malfunction (commutation failure) that CH2 is turned on by the positive feedback action of the lower portion 60b can be restrained, and the commutation characteristic can be improved further than in the first embodiment.

(Third Embodiment)

In the bidirectional photothyristor chip of the second embodiment, the diffusion regions are provided along the two mutually opposed sides in the periphery of the chip, while CH1 and CH2 are formed along the other mutually opposed two sides. Therefore, the region where the channel isolation region 70 is formed is the limited region in the center portion, and CH1 and CH2 cannot be formed so as to be completely separated from each other. Therefore, the commutation characteristic Icom cannot be sufficiently improved.

Moreover, as described above, the lengths of the anode diffusion regions, the P-gate diffusion regions and the cathode diffusion regions on the CH1 side and the CH2 side are shorter than in the case of the bidirectional photothyristor chip of the first embodiment. Therefore, the on-state voltage VT becomes high due to the short lengths of the opposed diffusion regions, and the heat generation of the device is increased.

Accordingly, in the present embodiment, a bidirectional photothyristor chip capable of improving the device characteristics and further improving the commutation characteristic Icom will be described.

Figure 5:
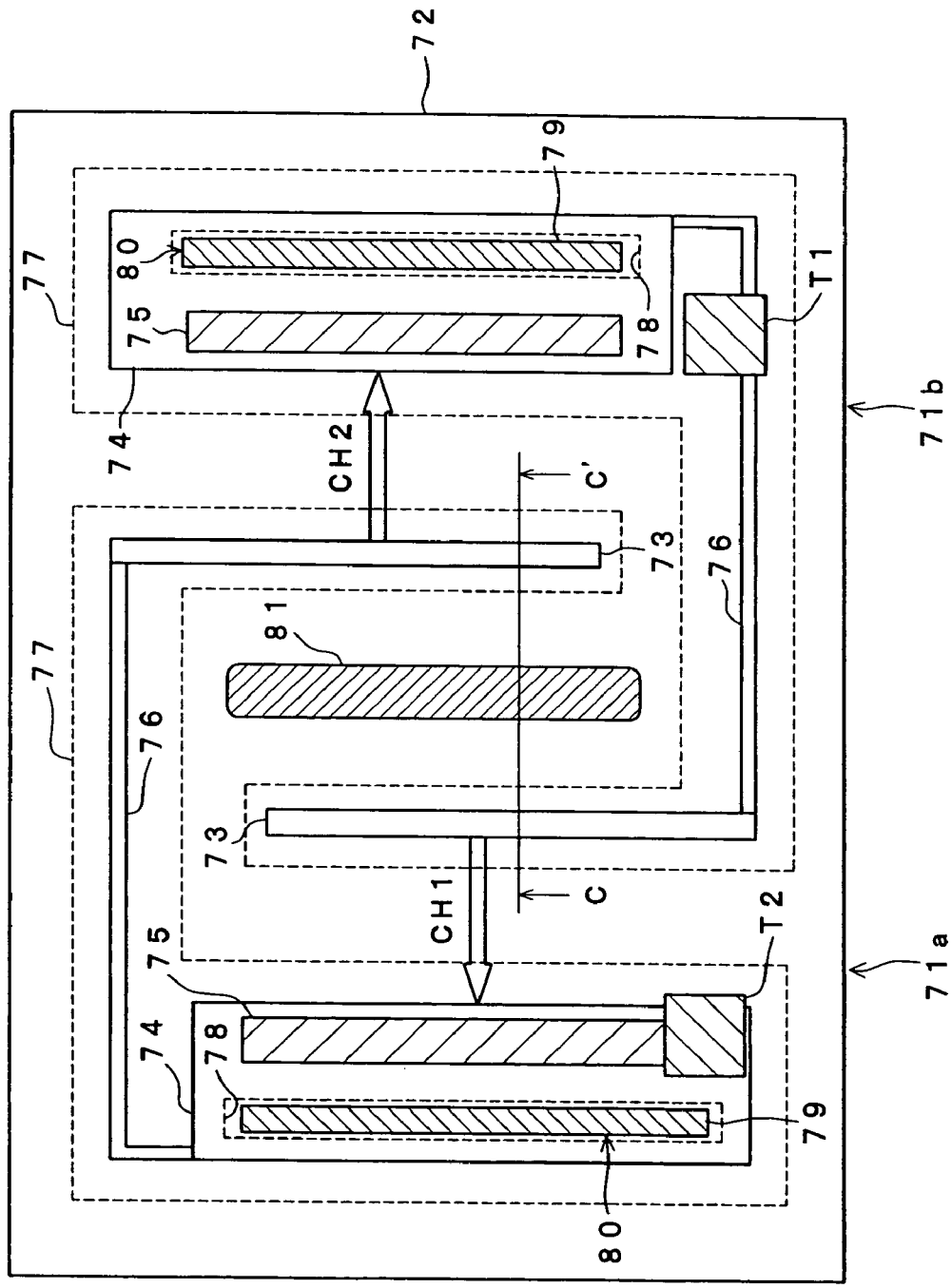
FIG. 5 is a view showing a schematic pattern layout different from those of FIGS. 1 and 4.

FIG. 5 shows the schematic pattern layout of the bidirectional photothyristor chip of the present embodiment. Although neither the sectional view nor the equivalent circuit diagram of FIG. 5 is shown, they are basically similar to those of FIGS. 2 and 3.

With regard to the pattern layout of the bidirectional photothyristor chip of the present embodiment, the anode diffusion region 32 on the CH2 side, which is located opposite from the P-gate diffusion region 33 on the CH2 side with respect to the P-gate diffusion region 33 on the CH1 side in the pattern layout of the bidirectional photothyristor chip of the first embodiment, is arranged between the P-gate diffusion region 33 on the CH1 side and the P-gate diffusion region 33 on the CH2 side, and the anode diffusion region on the CH2 side and the P-gate diffusion region and the cathode diffusion region on the CH2 side are opposed to each other. Likewise, the anode diffusion region 32 on the CH1 side is arranged between the P-gate diffusion region 33 on the CH1 side and the anode diffusion region on the CH2 side shifted in after position, and the anode diffusion region on the CH1 side and the P-gate diffusion region and the cathode diffusion region on the CH1 side are opposed to each other.

That is, in the bidirectional photothyristor chip of the present embodiment, as shown in FIG. 5, an anode diffusion region (P-type) 73 is formed inside a left-hand portion 71a, and a P-gate diffusion region (P-type) 74 opposed to this anode diffusion region 73 is formed outside on the front surface side of an N-type silicon substrate 72. Likewise, an anode diffusion region 73 is formed inside a right-hand portion 71b, and a P-gate diffusion region 74 opposed to this anode diffusion region 73 is formed outside. Further, a cathode diffusion region (N-type) 75 is formed on the side near the anode diffusion region 73 parallel along the side opposed to the anode diffusion region 73 inside each of the P-gate diffusion regions 74. Thus, a PNPN section is formed extended from the anode diffusion region 73 toward the cathode diffusion region 75 in each of the left-hand portion 71a and the right-hand portion 71b. It is to be noted that the reference numeral 76 denote gate resistors, which are arranged along the mutually opposed sides of the chip extended from the respective P-gate diffusion regions 74 to the anode diffusion regions 73 of the opposite channel.

As described above, in the bidirectional photothyristor chip of the present embodiment, the anode diffusion region 73, the P-gate diffusion region 74 and the cathode diffusion region 75 on the CH1 side are formed opposed to each other in the left-hand portion 71a. Moreover, the anode diffusion region 73, the P-gate diffusion region 74 and the cathode diffusion region 75 on the CH2 side are formed opposed to each other in the right-hand portion 71b. By forming the operating current region of CH1 and the operating current region of CH2 separately into the left-hand portion 71a and the right-hand portion 71b as described above, the operating current regions of CH1 and CH2 can be prevented from intersecting each other. Moreover, the lengths of the anode diffusion regions 73, the P-gate diffusion regions 74 and the cathode diffusion regions 75 can be made longer than in the case of the bidirectional photothyristor chip of the second embodiment. Therefore, the device characteristics can also be improved.

Then, an Al electrode 77 is formed as indicated by the dashed lines covering the P-gate diffusion region 74 and the cathode diffusion region 75 on the CH1 side of the left-hand portion 71a, the anode diffusion region 73 on the CH2 side of the right-hand portion 71b, and the gate resistor 76 which connects the P-gate diffusion region 74 on the CH1 side with the anode diffusion regions 73 on the CH2 side. Likewise, an Al electrode 77 is formed as indicated by the dashed lines covering the P-gate diffusion region 74 and the cathode diffusion region 75 on the CH2 side of the right-hand portion 71b, the anode diffusion region 73 on the CH1 side of the left-hand portion 71a, and the gate resistor 76 which connects the P-gate diffusion region 74 on the CH2 side with the anode diffusion region 73 on the CH1 side.

Then, a rectangular aperture 78 of approximately the same length is formed parallel to the cathode diffusion region 75 at the Al electrode 77 in the region where the cathode diffusion region 75 is not formed in both the P-gate diffusion regions 74. Then, an Al electrode 79 brought in direct contact with the N-type silicon substrate 72 is formed inside the aperture 78 of this Al electrode 77 similarly to the cases of the first and second embodiments, so that a Schottky barrier diode 80 is formed between the P-gate diffusion region 74 and the N-type silicon substrate 72.

Therefore, the injection of minority carriers (holes) from the P-gate diffusion region 74 to the N-type silicon substrate 72 is restrained. As a result, the amount of carriers remaining in the N-type silicon substrate 72 is reduced, allowing the commutation characteristic to be improved.

Although no description is provided, an $SiO_2$ film is formed on the N-type silicon substrate 72 similarly to the case of the bidirectional photothyristor chip of the first embodiment, providing insulation with respect to the Al electrode 77 in required portions. Moreover, in FIG. 5, the N-type diffusion region as the channel stopper formed along the periphery of the chip and the Al electrode on this N-type diffusion region are not shown in FIG. 4. Moreover, an electrode T1 and an electrode T2 are formed right above the Al electrode 77 similarly to the case of the bidirectional photothyristor chip of the first embodiment.

In the present embodiment, a channel isolation region 81 is formed between both the anode diffusion regions 73 and 73 (i.e., between CH1 and CH2) on the N-type silicon substrate 72 and between both the gate resistors 76 and 76 while being extended in the direction in which the anode diffusion regions 73 are extended. Therefore, holes of minority carriers in the N-type silicon substrate 72 are drawn in by this channel isolation region 81 during the commutation, limiting the movement of holes between the channels.

In the above case, CH1 is formed in the left-hand portion 71a, and CH2 is formed in the right-hand portion 71b. Therefore, the channel isolation region 81 and the operating current regions of CH1 and CH2 do not intersect each other, and the channel isolation region 81 can be formed longer than the channel separation region 70 of the second embodiment along the anode diffusion regions 73.

Therefore, the holes, which are remaining in the N-type silicon substrate 72 of the left-hand portion 71a, can be more adequately prevented from moving to the right-hand portion 71b than in the case of the channel isolation region 70 of the second embodiment when, for example, CH1 is turned off. As a result, in cooperation with the effect of restraining the injection of minority carriers (holes) from the P-gate diffusion region 74 to the N-type silicon substrate 72 produced by the Schottky barrier diode 80 and the effect that the operating current regions of CH1 and CH2 do not intersect each other, the malfunction (commutation failure) that CH2 is turned on by the positive feedback action of the right-hand portion 71b can be restrained more effectively, and the commutation characteristic can be improved further than in the second embodiment.

Although no description is provided in the second and third embodiments, similarly to the case of the first embodiment, it is preferable to set the forward voltage of the Schottky barrier diodes 69 and 80 to a value 20 mV or more lower than the forward voltage across the P-gate diffusion regions 63 and 74 and the N-type silicon substrates 61 and 72 of the thyristor to be adopted. Moreover, it is preferable to set the width L1 (see FIG. 2) of the aperture of the P-gate diffusion regions 63 and 74 of the Schottky barrier diodes 69 and 80 to a distance such that the Schottky barrier diodes 69 and 80 can effect pinch-off within the withstand voltage. Moreover, it is preferable to form an $N^+$ layer of a phosphorus concentration of not smaller than $10^{15}$ cm$^{-3}$ and not greater than $10^{18}$ cm$^{-3}$ on the back surface of the N-type silicon substrates 61 and 72 in order to satisfy the trade-off correlation relevant to the commutation characteristic Icom and the critical off-state voltage increase rate dv/dt characteristic.

(Fourth Embodiment)

Figure 6:
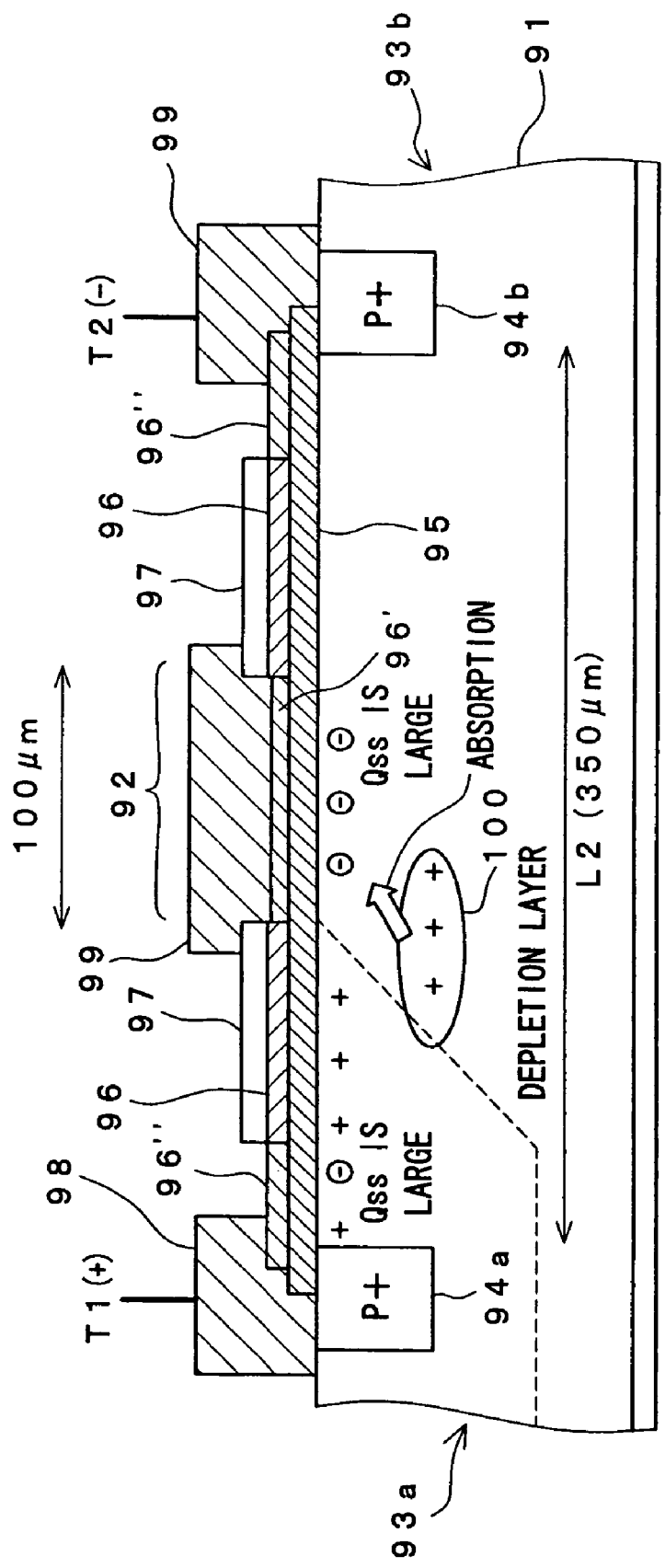
FIG. 6 is a sectional view showing a concrete construction of a channel isolation region in FIGS. 4 and 5.

A concrete construction of the channel isolation regions 70 and 81 of the second and third embodiments will be described below. FIG. 6 is a sectional view of an N-type silicon substrate 91 in the neighborhood of the channel isolation region showing the passivation structure of the present embodiment. FIG. 6 corresponds to the sectional view taken along the arrow line C–C' in FIG. 5, but a quite similar application can be provided also in the case of the channel isolation region 70 in FIG. 4.

A channel isolation region 92 in the present embodiment is constructed of an oxygen doped semi-insulating polycrystalline silicon film doped with phosphorus formed on the N-type silicon substrate 91. If the oxygen doped semi-insulating polycrystalline silicon film is doped with phosphorus, the level of the oxygen doped semi-insulating polycrystalline silicon film is increased, and the silicon interface state (Qss) consequently increases. Therefore, holes of minority carriers in the N-type silicon substrate 91 can be made to positively disappear, and the reduction in the lifetime of holes can be promoted.

An $SiO_2$ film 95 is formed over an anode diffusion region 94a of a left-hand portion 93a to an anode diffusion region 94b of a right-hand portion 93b in the left-hand portion 93a and the right-hand portion 93b of the channel isolation region 92 on the N-type silicon substrate 91. Further, an oxygen doped semi-insulating polycrystalline silicon film 96 is formed on this $SiO_2$ film 95, and a region 96' in the neighborhood of the channel isolation region 92 of the oxygen doped semi-insulating polycrystalline silicon film 96 and regions 96" in both end portions are doped with phosphorus. With this arrangement, the silicon interface state Qss is increased in the region 96' of the channel isolation region 92 on the surface of the N-type silicon substrate 91 and the regions 96" in both end portions.

Further, an $SiO_2$ film 97 is formed on a region that is not doped with phosphorus in the oxygen doped semi-insulating polycrystalline silicon film 96 by the chemical vapor deposition method. Then, an Al electrode 98 is formed over the anode diffusion region 94 to the oxygen doped semi-insulating polycrystalline silicon film 96" in the positions of both end portions 96" doped with phosphorus in the oxygen doped semi-insulating polycrystalline silicon film 96 and connected to an electrode T1 or an electrode T2. On the other hand, an Al electrode 99 is formed over an $SiO_2$ film 97 of the left-hand portion 93a to an $SiO_2$ film 97 of the right-hand portion 93b in the region 96' doped with phosphorus in the oxygen doped semi-insulating polycrystalline silicon film 96 and connected to the N-type silicon substrate 91. By thus bringing both the ends and the center portion of the oxygen doped semi-insulating polycrystalline silicon film 96 in contact with the Al electrodes 98 and 99 for the formation of a potential gradient between both the Al electrodes 98 and 99, the concentration of electric fields on the Si—$SiO_2$ interface is alleviated. Thus, a field plate structure that is advantageously able to have a high withstand voltage is provided.

With the above-mentioned arrangement, the silicon interface state Qss in the position of the channel isolation region 92 on the surface of the N-type silicon substrate 91 is increased. Therefore, holes 100 of minority carriers in the N-type silicon substrate 91 are made to disappear in the channel isolation region 92, and the movement of holes between channels is limited.

Further, the oxygen doped semi-insulating polycrystalline silicon film 96 on the anode diffusion region 94 is doped with phosphorus. Therefore, the silicon interface state Qss in the neighborhood of the channel isolation region 92 of the anode diffusion region 94 on the surface of the N-type silicon substrate 91 is increased, and the current amplification factor Hfe(pnp) of the PNP transistor including the anode diffusion region 94 is reduced. As a result, a holding current (hereinafter referred to as IH) is increased to 500 $\mu$A or more and the time during which the on-state of the PNPN section continues becomes long. This provides a time delay to the occurrence of the malfunction during the commutation and allows the more effective disappearance of carriers that move to the opposite channel.

The method for increasing the IH to 500 $\mu$A or more is not limited to the aforementioned (1) reduction in the current amplification factor Hfe(pnp) of the PNP transistor and can also be achieved by (2) increasing the area ratio of the cathode diffusion area with respect to the P-gate diffusion area or (3) reducing the current amplification factor Hfe (npn) of the NPN transistor or the gate resistance value.

The higher the concentration of phosphorus implanted into the oxygen doped semi-insulating polycrystalline silicon film 96, the more the silicon interface state Qss increases, which is effective for the improvement of the commutation characteristic. However, there is an adverse influence exerted on the inherent reliability and so on of the device if the concentration is too high, and therefore, a sheet resistance of not lower than 1 $\Omega/\square$ and not higher than 2000 $\Omega/\square$ is appropriate. Moreover, although the distance L2 between the channels is set to 350 $\mu$m, it is advantageous for the distance to be 300 $\mu$m or longer in terms of the separation of carriers. It is to be noted that the rightsizing of the distance is required because the chip size is increased. Moreover, although the width of the channel isolation region 92, or the width of the phosphorus doped region 96' of the oxygen doped semi-insulating polycrystalline silicon film 96 located at the boundary between the left-hand portion 93a and the right-hand portion 93b is set to 100 $\mu$m, the width is required to be not smaller than 50 $\mu$m.

Moreover, the Al electrode 99 formed in the position of the channel isolation region 92 can function also as a light shading film.

(Fifth Embodiment)

Figure 7:
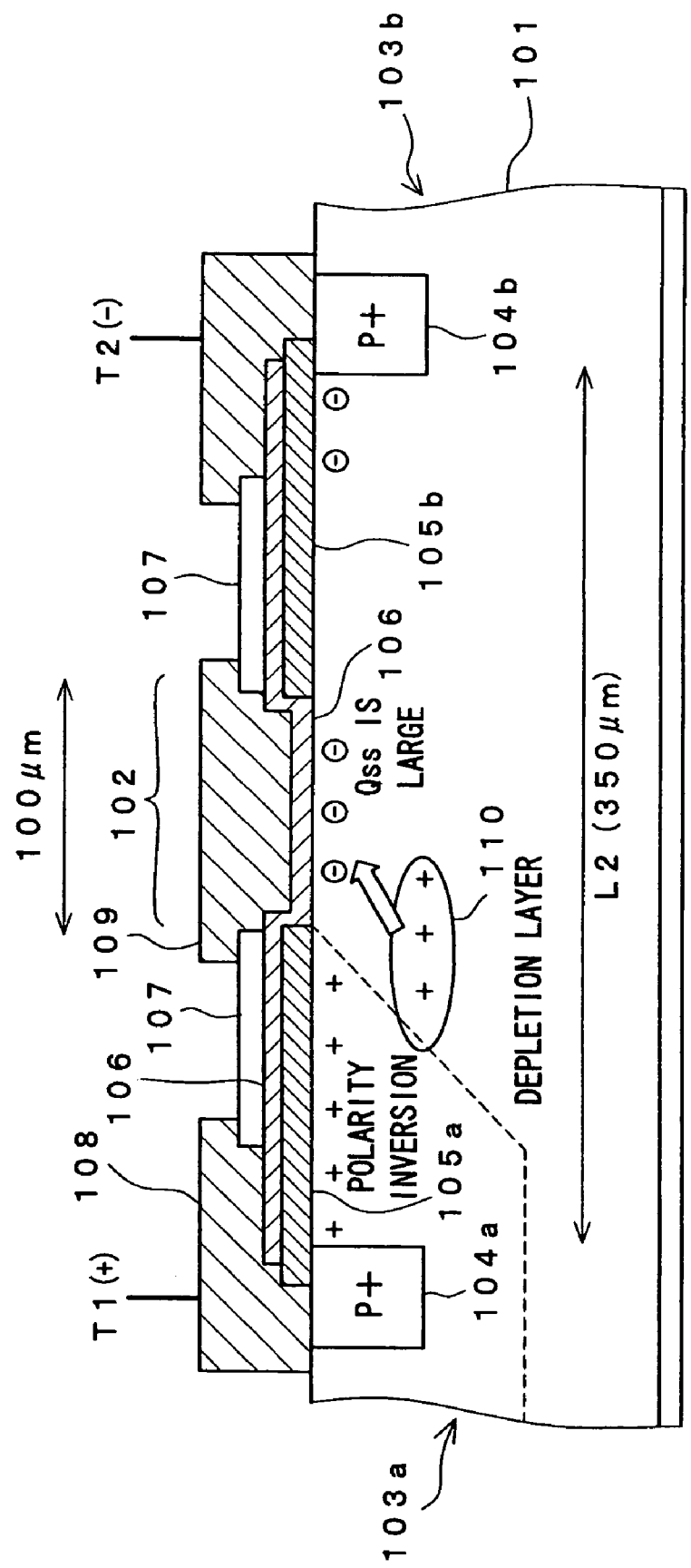
FIG. 7 is a sectional view showing the construction of a channel isolation region different from that of FIG. 6.

FIG. 7 is a sectional view of an N-type silicon substrate 101 in the neighborhood of the channel isolation region 101 showing the passivation structure of the present embodiment. The channel isolation region 102 of the present embodiment is constituted by directly forming an oxygen doped semi-insulating polycrystalline silicon film on the surface of an N-type silicon substrate 101. FIG. 7 corresponds to the sectional view taken along the arrow line C–C' in FIG. 5, but a quite similar application can be provided also in the case of the channel isolation region 70 in FIG. 4.

An $SiO_2$ film 105 is formed over an anode diffusion region 104a of a left-hand portion 103a to an anode diffusion region 104b of a right-hand portion 103b in the left-hand portion 103a and the right-hand portion 103b of the channel isolation region 102 on an N-type silicon substrate 101. Then, an $SiO_2$ film 105 in the portion of the channel isolation region 102 is removed to expose the N-type silicon substrate 101. In the above-mentioned state, an oxygen doped semi-insulating polycrystalline silicon film 106 is formed over an anode diffusion region 104a of an $SiO_2$ film 105a of a left-hand portion 103a to an anode diffusion region 104b of an $SiO_2$ film 105b of a right-hand portion 103b. Thus, the oxygen doped semi-insulating polycrystalline silicon film 106 is directly formed in contact with the surface of the N-type silicon substrate 101 in the channel isolation region 102.

Further, an $SiO_2$ film 107 is formed on the oxygen doped semi-insulating polycrystalline silicon film 106 in the region on the $SiO_2$ film 105 by the chemical vapor deposition method. Then, an Al electrode 108 is formed over the surface of the anode diffusion region 104 to the surface of the $SiO_2$ film 107 and connected to an electrode T1 or an electrode T2. On the other hand, an Al electrode 109 is formed over the surface of the $SiO_2$ film 107 of the left-hand portion 103a to the surface of the SiO$_2$ film 107 of the right-hand portion 103b and connected to the N-type silicon substrate 101. By thus bringing the end portions and the center portion of the oxygen doped semi-insulating polycrystalline silicon film 106 in contact with the Al electrodes 108 and 109 for the formation of a potential gradient between both the Al electrodes 108 and 109, the concentration of electric fields on the Si—SiO$_2$ interface is alleviated. Thus, a field plate structure is formed also in the present embodiment.

With the above-mentioned arrangement, the oxygen doped semi-insulating polycrystalline silicon film 106 is directly formed in the channel isolation region 102 on the surface of the N-type silicon substrate 101. By adopting the above-mentioned structure, the silicon interface state Qss is increased more remarkably in the present channel isolation region 102 than in the channel isolation region 92 of the fourth embodiment. Therefore, the reduction in the lifetime of holes 110 of minority carriers in the N-type silicon substrate 101 can be highly promoted similarly to the case of the fourth embodiment.

Although the distance L2 between the channels is set to 350 μm, it is advantageous for the distance to be 300 μm or longer in terms of the separation of carriers. It is to be noted that the rightsizing of the distance is required because the chip size is increased. Moreover, although the width of the channel isolation region 102, or the interval between the SiO$_2$ film 105a of the left-hand portion 103a and the SiO$_2$ film 105b of the right-hand portion 103b is set to 100 μm, the interval is required to be not smaller than 50 μm.

Moreover, the Al electrode 109 formed in the position of the channel isolation region 102 can function also as a light shading film.

(Sixth Embodiment)

Figure 8:
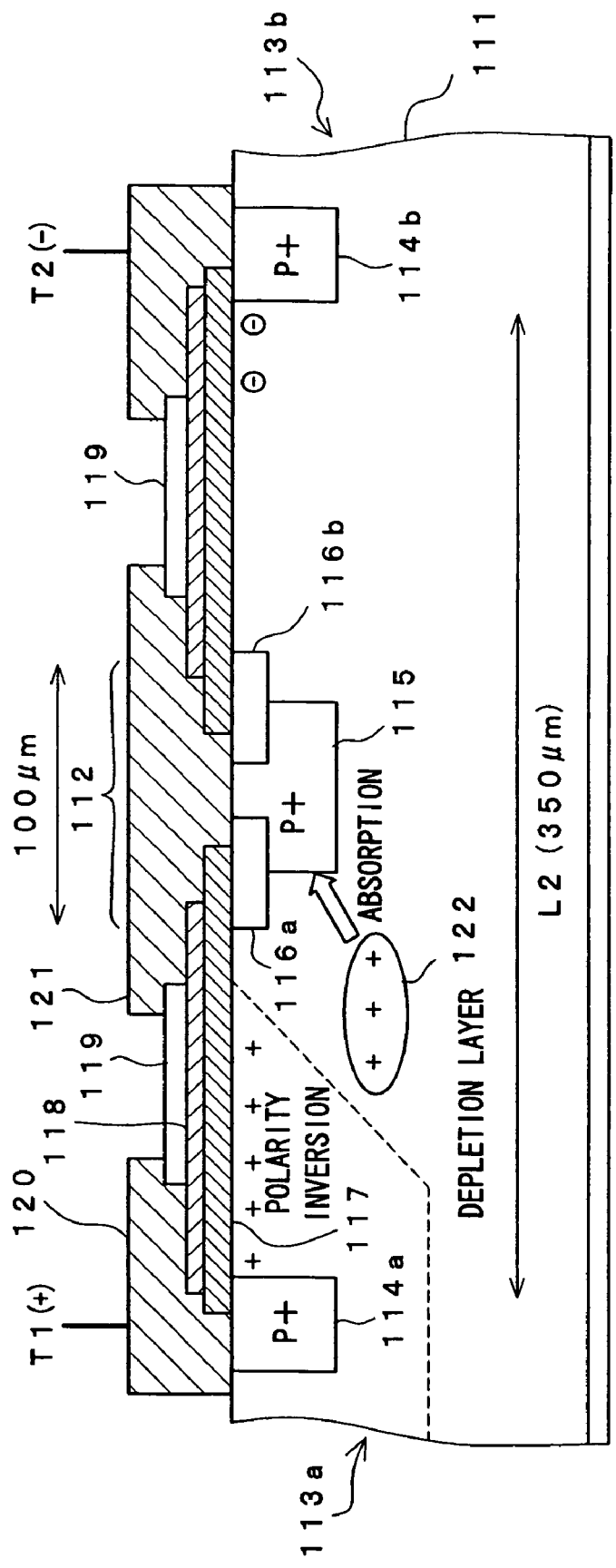
FIG. 8 is a sectional view showing the construction of a channel isolation region different from those of FIGS. 6 and 7.

FIG. 8 is a sectional view of an N-type silicon substrate 111 in the neighborhood of the channel isolation region showing the passivation structure of the present embodiment. A channel isolation region 112 in the present embodiment is constructed of a short-circuit diode formed short-circuited on the surface of the N-type silicon substrate 111. FIG. 8 corresponds to the sectional view taken along the arrow line C–C' in FIG. 5, but a quite similar application can be provided also in the case of the channel isolation region 70 in FIG. 4.

A P-type diffusion region 115 is formed in the region of the channel isolation region 112 on the surface of the N-type silicon substrate 111, and an N-type diffusion region 116a as a channel stopper is formed extended from the N-type silicon substrate 111 to the P-type diffusion region 115 in the position of the left-hand side surface of the P-type diffusion region 115, and an N-type diffusion region 116b is similarly formed in the position of the right-hand side surface of the P-type diffusion region 115.

An SiO$_2$ film 117 is formed over an anode diffusion region 114 to the N-type diffusion region 116 in each of the left-hand portion 113a and the right-hand portion 113b. Then, an oxygen doped semi-insulating polycrystalline silicon film 118 is formed extended from the neighborhood of the anode diffusion region 114 on the SiO$_2$ film 117 to the neighborhood of the N-type diffusion region 116. Further, an SiO$_2$ film 119 is formed on the oxygen doped semi-insulating polycrystalline silicon film 118 by the chemical vapor deposition method. Then, an Al electrode 120 is formed extended from the surface of the anode diffusion region 114 to the surface of the SiO$_2$ film 119 and connected to an electrode T1 or an electrode T2. On the other hand, an Al electrode 121 is formed extended from the surface of the SiO$_2$ film 119 of the left-hand portion 113a to the surface of the SiO$_2$ film 119 of the right-hand portion 113b and connected to the N-type silicon substrate 111. By thus bringing both ends of the oxygen doped semi-insulating polycrystalline silicon film 118 in contact with the Al electrodes 120 and 121 for the formation of a potential gradient between both the Al electrodes 120 and 121, the concentration of electric fields on the Si—SiO$_2$ interface is alleviated. Thus, a field plate structure is formed also in the present embodiment.

With the above-mentioned construction, the short-circuit diode short-circuited by the P-type diffusion region 115 and the N-type diffusion region 116 is constructed in the channel isolation region 112 on the surface of the N-type silicon substrate 111. Therefore, holes 122 of minority carriers in the N-type silicon substrate 111 are absorbed into the P-type diffusion region 115 of the short-circuit diode, and the lifetime of the holes 122 is reduced.

Although the distance L2 between the channels is set at 350 μm, it is advantageous for the distance to be 300 μm or longer in terms of the separation of carriers. It is to be noted that the rightsizing of the distance is required because the chip size is increased. Moreover, although the width of the channel isolation region 112, or the distance between the outer edge of the N-type diffusion region 116a of the left-hand portion 113a and the outer edge of the N-type diffusion region 116b of the right-hand portion 113b is set to 100 μm, the width is required to be not smaller than 50 μm.

Moreover, the Al electrode 121 formed in the position of the channel isolation region 112 can also function as a light shading film, which can restrict the occurrence of carriers as a consequence of the intrusion of light from the region of the short-circuit diode during light reception.

The present invention is limited to neither of the aforementioned embodiments and is allowed to be appropriately modified within the scope claimed in the patent claims. For example, the conductive types of the semiconductors may be opposite to those of the aforementioned embodiments. Moreover, it is acceptable to properly select materials within a range in which the aforementioned functions and effects are produced.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A bidirectional photothyristor chip comprising:
    (a) a substrate having a first conductive type,
    (b) a pair of photothyristor sections including a first diffusion region having a second conductive type, a second diffusion region having the second conductive type and a third diffusion region inside the second diffusion region having a first conductive type, and
    (c) a Schottky barrier diode formed between the second diffusion region and the substrate.

2. The bidirectional photothyristor chip as claimed in claim 1, wherein
    the third diffusion region is formed on a first side of the second diffusion region,
    the Schottky barrier diode is formed on a second side of the second diffusion region with a length approximately equal to that of the third diffusion region and with a prescribed width.

3. The bidirectional photothyristor chip as claimed in claim 2, wherein an area of the Schottky barrier diode is changed by changing a width of the Schottky barrier diode, and a forward voltage of the Schottky barrier diode can be set by changing the area of the Schottky barrier diode.

4. The bidirectional photothyristor chip as claimed in claim 3, wherein the width of the Schottky barrier diode is set so that the forward voltage of the Schottky barrier diode is 20 mV or more lower than the forward voltage across the second diffusion region of the photothyristor section and the substrate.

5. The bidirectional photothyristor chip as claimed in claim 3, wherein an interval between two diffusion regions located with interposition of a gate of the Schottky barrier diode is set to a distance at which the Schottky barrier diode can effect pinch-off within its withstand voltage.

6. The bidirectional photothyristor chip as claimed in claim 1, wherein the substrate is an N-type silicon substrate, and an $N^+$ layer doped with phosphorus at a concentration of not smaller than $10^{15}$ $cm^{-3}$ and not greater than $10^{18}$ $cm^{-3}$ is formed on a back surface of the N-type silicon substrate.

7. The bidirectional photothyristor chip as claimed in claim 1, wherein the substrate is an N-type silicon substrate, each of the first, second and third diffusion regions are arranged so that operating current regions of channels of the photothyristor sections do not intersect each other, and a channel isolation region for providing isolation between the operating current regions is provided on the surface of the substrate.

8. The bidirectional photothyristor chip as claimed in claim 7, wherein the channel isolation region comprises an oxygen doped semi-insulating polycrystalline silicon film doped with phosphorus formed on the surface of the N-type silicon substrate.

9. The bidirectional photothyristor chip as claimed in claim 7, wherein the channel isolation region comprises an oxygen doped semi-insulating polycrystalline silicon film formed in contact with the surface of the N-type silicon substrate.

10. The bidirectional photothyristor chip as claimed in claim 7, wherein the channel isolation region comprises a short-circuit diode formed on a surface of the semiconductor chip.

* * * * *